United States Patent
Burnett et al.

(10) Patent No.: US 7,414,877 B2
(45) Date of Patent: Aug. 19, 2008

(54) ELECTRONIC DEVICE INCLUDING A STATIC-RANDOM-ACCESS MEMORY CELL AND A PROCESS OF FORMING THE ELECTRONIC DEVICE

(75) Inventors: James D. Burnett, Austin, TX (US); Bich-Yen Nguyen, Austin, TX (US); Brian A. Winstead, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 390 days.

(21) Appl. No.: 11/337,355

(22) Filed: Jan. 23, 2006

(65) Prior Publication Data
US 2007/0171700 A1    Jul. 26, 2007

(51) Int. Cl.
*G11C 11/00* (2006.01)
(52) U.S. Cl. .................. 365/154; 365/63; 365/156
(58) Field of Classification Search .............. 365/154, 365/156, 149, 51, 63
See application file for complete search history.

(56) References Cited

U.S. PATENT DOCUMENTS

| | | | |
|---|---|---|---|
| 5,384,473 A | 1/1995 | Yoshikawa et al. | |
| 5,698,893 A * | 12/1997 | Perera et al. | 257/627 |
| 6,697,294 B1 * | 2/2004 | Qi et al. | 365/210.15 |
| 6,794,718 B2 * | 9/2004 | Nowak et al. | 257/347 |
| 6,867,460 B1 | 3/2005 | Anderson et al. | |
| 7,115,920 B2 * | 10/2006 | Bernstein et al. | 257/204 |
| 2003/0102518 A1 | 6/2003 | Fried et al. | |
| 2007/0069277 A1* | 3/2007 | Yang et al. | 257/315 |
| 2007/0108528 A1* | 5/2007 | Anderson et al. | 257/365 |

* cited by examiner

*Primary Examiner*—Son Dinh
*Assistant Examiner*—Hien N Nguyen (57) ABSTRACT

An electronic device can include a static-random-access memory cell. The static-random-access memory cell can include a first transistor of a first type and a second transistor of a second type. The first transistor can have a first channel length extending along a first line, and the second transistor can have a second channel length extending along a second line. The first line and the second line can intersect at an angle having a value other than any integer multiple of 22.5°. In a particular embodiment, the first transistor can include a pull-up transistor, and the second transistor can include a pass gate or pull-down transistor. A process can be used to form semiconductor fins and conductive members, which include gate electrode portions, to achieve the electronic device including the first and second transistors.

20 Claims, 6 Drawing Sheets

ELECTRONIC DEVICE INCLUDING A STATIC-RANDOM-ACCESS MEMORY CELL AND A PROCESS OF FORMING THE ELECTRONIC DEVICE

BACKGROUND

1. Field of the Disclosure

The present disclosure relates to electronic devices and processes, and more particularly to electronic devices including static-random-access memory cells and processes of forming the electronic devices.

2. Description of the Related Art

Figure 1:
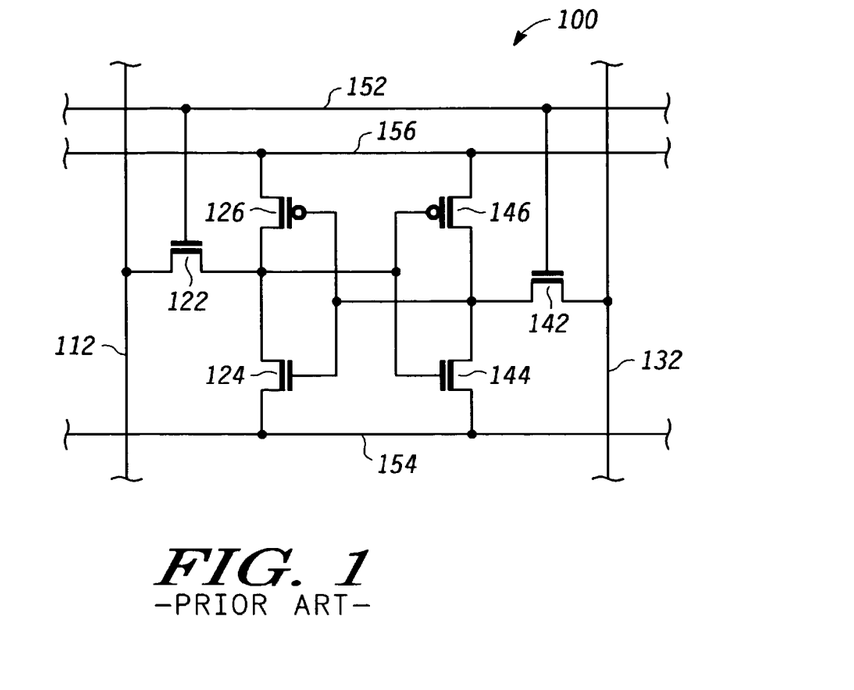
FIG. 1 includes a circuit schematic of a SRAM cell. (Prior art)

Static-random-access memory ("SRAM") cells are commonly used within integrated circuits as stand alone memories or as a memory array within a microcontroller, microprocessor, or other electronic device. FIG. 1 includes a circuit schematic for a six-transistor SRAM cell 100. A bit line 112 is electrically connected to a source/drain ("S/D") region of a pass gate transistor 122. As used herein, S/D region will be used to refer to a region that can act as a source region, a drain region, or a region that can act as a source or drain, depending on biasing conditions. Another S/D region of pass gate transistor 122 is electrically connected to S/D regions of a pull-down transistor 124 and a pull-up transistor 126 and to gate electrodes of a pull-down transistor 144 and a pull-up transistor 146. The node, which is formed by the electrical connections between the S/D regions of transistors 122, 124, and 126 and the gate electrodes of transistors 144 and 146, is a storage node of the SRAM cell 100.

A S/D region of pass gate transistor 142 is electrically connected to a different bit line 132. During the write operation and at the end of the read operation of the memory cell 100, the signal on the bit line 132 is complementary to the signal on the bit line 112. Bit line 112 or 132 may be referred to as BL, and the other bit line 112 or 132 may be referred to as BL bar. For example, if the signal on bit line 112 has a value corresponding to "high" or "1", the signal on bit line 132 typically has a value of "low" or "0" during the write operation or at the end of the read operation. Another S/D region of the pass gate transistor 142 is electrically connected to S/D regions of the pull-down transistor 144 and the pull-up transistor 146 and to gate electrodes of the pull-down 124 and the pull-up transistor 126. The node, which is formed by the electrical connections between the S/D regions of the transistors 142, 144, and 146 and the gate electrodes of the transistors 124 and 126, is another storage node of the SRAM cell 100.

The gate electrodes of pass gate transistors 122 and 142 are electrically connected to a word line 152. Other S/D regions of the pull-down transistors 124 and 144 are electrically connected to a $V_{SS}$ line 154, and other S/D regions of pull-up transistors 126 and 146 are electrically connected to a $V_{DD}$ line 156. Typically, transistors 122, 124, 142, and 144 are n-channel transistors, and transistors 126 and 146 are p-channel transistors.

Figure 2:
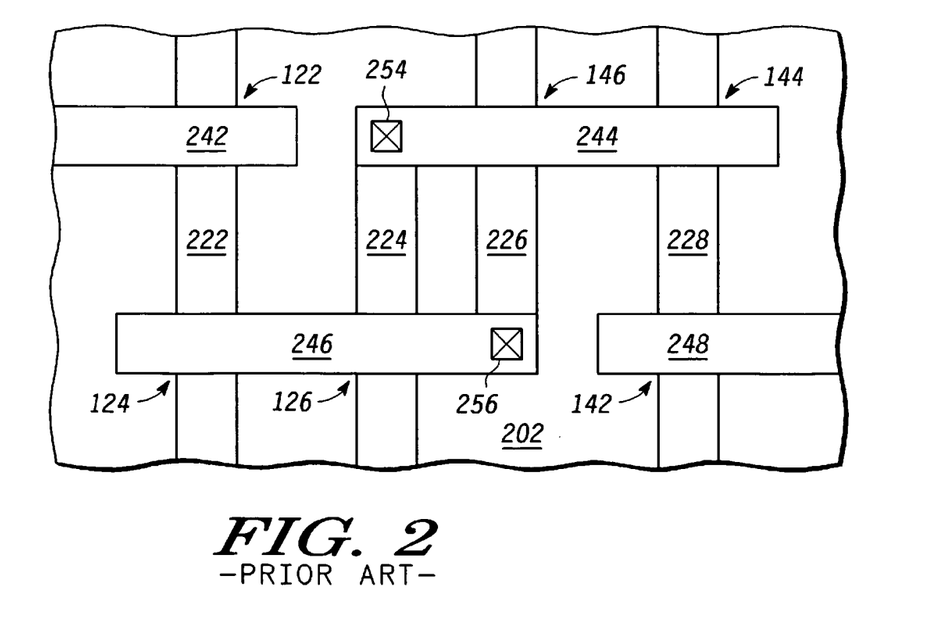
FIG. 2 includes an illustration of a top view of a layout of semiconductor fins and conductive members for the SRAM cell. (Prior art)

Semiconductor-on-insulator ("SOI") technology can be used in forming memory cells. FIG. 2 includes an illustration of a layout of active regions and conductive members that may be used for an SRAM cell. As used throughout this specification, insulating layers are not illustrated in top views to simplify understanding of the positional relationships of features to one another.

FIG. 2 includes semiconductor fins 222, 224, 226, and 228 that overlie a base material 202 (e.g., a semiconductor wafer). In FIG. 2, the semiconductor fins 222, 224, 226, and 228 are patterned such that they extend in vertical directions as illustrated in FIG. 2. Conductive members 242, 244, 246, and 248 extend in horizontal directions as illustrated in FIG. 2 and overlie portions of the semiconductor fins. Portions of the conductive members 242, 244, 246, and 248 include gate electrodes where those conductive members lie adjacent to the semiconductor fins. Locations of transistors 122, 124, 126, 142, 144, and 146 are illustrated in FIG. 2.

The semiconductor fin 224 has a portion that is electrically connected to the conductive member 244 at contact 254, and the semiconductor fin 226 is electrically connected to the conductive member 246 at contact 256. Although not illustrated, other contacts and conductive members or other interconnects can be formed to complete the electrical connections to achieve and SRAM cell. For example, the conductive members 242 and 248 may be connected to an overlying conductive member (not illustrated) that forms part of the word line 152. Another overlying conductive member (not illustrated) may be formed at the same level to complete the electrical connections for the storage nodes of the SRAM cell. Other conductive members or interconnects can be formed to make the connections to the bit lines 112 and 132, the $V_{SS}$ line 154, and $V_{DD}$ line 156.

By using rectilinear patterns for the features within the SRAM cell, as illustrated in FIG. 2, the SRAM may occupy too much area, and thus lower the memory cell density within a memory array. In addition, the transistors have channel lengths that lie long substantially parallel lines that are typically along a (100) or (110) crystal plane. Regarding the (100) and (110) crystal planes, those crystal planes intersect at 45° when the primary surface a semiconductor layer lies along a (100) or (110) crystal plane. Electron mobility is higher along a (100) crystal plane, as opposed to a (110) crystal plane, and hole mobility is higher along a (110) crystal plane, as opposed to a (100) crystal plane. The electronic characteristics for the transistors may not be optimized for use within the SRAM cell.

One or more of the semiconductor fins could include portions that lie along different lines that intersect at angles that are integer multiples of 22.5° (e.g., 0°, 22.5°, 45°, 67.5°, etc.). While angles can be integer multiples of 22.5°, the use of discrete values for the angles still may limit how much the area of the memory cell can be reduced, may not allow the electronic performance of the SRAM cell to be optimized, or both.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device can include a static-random-access memory cell. The static-random-access memory cell can include a first transistor of a first type and a second transistor of a second type. The first transistor can have a first channel length extending along a first line, and the second transistor can have a second channel length extending along a second line. The first line and the second line can intersect at an angle having a value other than any integer multiple of 22.5°. In a particular embodiment, the first transistor can be a pull-up transistor, and the second transistor can be a pass gate or pull-down transistor.

A process of forming an electronic device, including a static-random-access memory cell, can include forming a first semiconductor fin over a substrate, and forming a second semiconductor fin over the substrate, wherein the second semiconductor fin can be spaced apart from the first semiconductor fin. The process can also include forming a first gate electrode adjacent to a first portion of the first semiconductor fin, wherein the first portion can have a first length extending along a first line, and forming a second gate electrode adjacent to a second portion of the second semiconductor fin, wherein the second portion can have a second length extending along a second line. The first line and the second line can intersect at an angle having a value other than any integer multiple of 22.5°.

Before addressing details of embodiments described below, some terms are defined or clarified. Group numbers corresponding to columns within the Periodic Table of the elements use the "New Notation" convention as seen in the *CRC Handbook of Chemistry and Physics*, 81$^{st}$ Edition (2000).

The term "channel length" is intended to mean the distance between the S/D regions of a transistor along a direction in which carriers are designed to principally flow through a channel region of the transistor, when the transistor is operated.

The term "high-k," with respect to dielectric constant, is intended to mean a dielectric constant of at least 8.0.

The term "primary surface" is intended to mean a surface of a substrate or a layer overlying the substrate or a portion of the substrate or layer from which a transistor is subsequently formed. The primary surface may be an original surface of a base material before forming any electronic components or may be a surface of the semiconductor layer that overlies the base material. For example, an exposed surface of a semiconductor layer of a semiconductor-on-insulator substrate can be a primary surface, and not the original surface of the base material.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the semiconductor and microelectronic arts.

Figure 3:
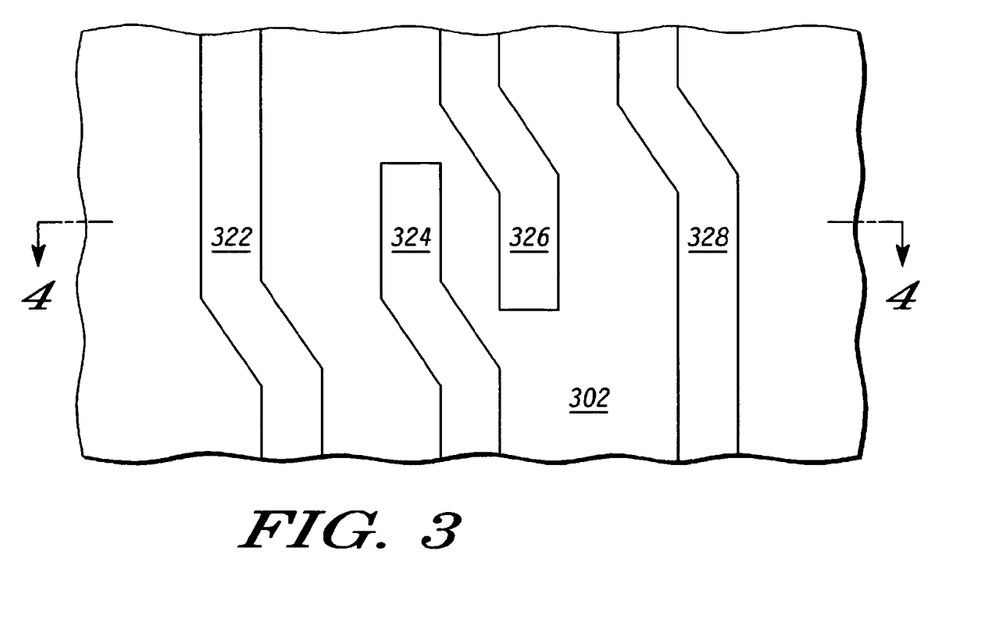
FIGS. 3 and 4 includes illustrations of a top view and a cross-sectional view, respectively, of a portion of a workpiece after forming semiconductor fins.
Figure 4:
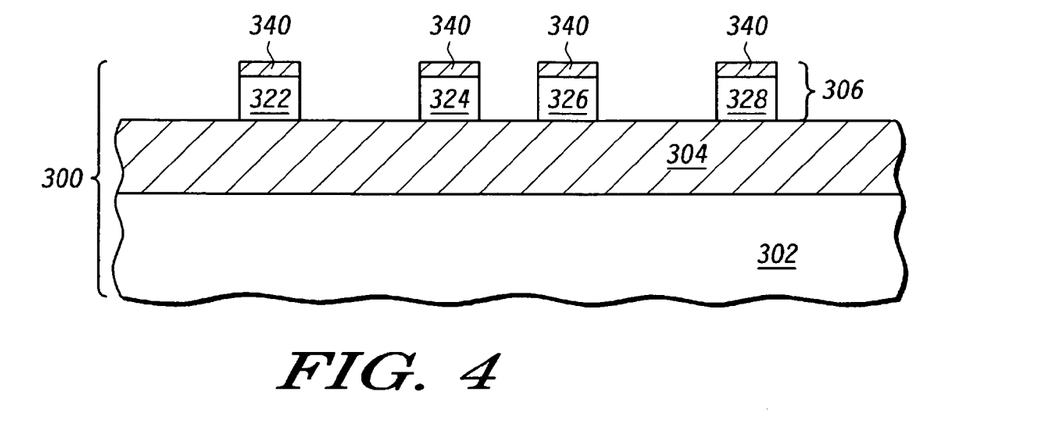

FIGS. 3 and 4 include illustrations of a top view-and a cross-sectional view, respectively, after forming semiconductor fins 322, 324, 326, and 328 overlying a base material 302. FIG. 4 is a cross-sectional view, as taken along sectioning line 4-4 in FIG. 3. The positional relationships of the semiconductor fins, as seen in FIG. 3, will be described before addressing the formation sequence with regard to FIG. 4. The semiconductor fins 322, 324, 326, and 328 include portions that have lengths that extend along lines that are substantially vertical with respect to FIG. 3. The semiconductor fins 322, 324, 326, and 328 also include other portions that have lengths that extend lines that are at an angle with respect to those other portions. The angles may not be an integer multiple of 22.5°. The significance of the angles will be described in more detail later in this specification.

FIG. 4 includes an SOI substrate 300 that includes a base material 302, an insulating layer 304, and a semiconductor layer 306. The base material 302 can include a material that can withstand processing temperatures and other conditions as used in semiconductor fabrication processes and does not significantly migrate through the insulating layer 304 and affect the semiconductor layer 306. For example, the base material 302 can include a Group 14 element (e.g., silicon, carbon, germanium, or any combination thereof), a III-V (Group 13-Group 15) semiconductor (e.g., GaAs, InP, GaAIAs, etc.), a II-VI (Group 2-Group 16 or Group 12-Group 16) semiconductor (e.g., CdTe, CdSe, CdZnTe, ZnSe, ZnTe, etc.), a metal-containing material, an insulating material, one or more other suitable materials capable of withstanding processing temperatures as used in semiconductor fabrication processes, or any combination thereof.

The insulating layer 304 can include an oxide, a nitride, an oxynitride, or any combination thereof. The insulating layer 304 has a thickness sufficient, such that capacitive coupling between the semiconductor layer 306 and the base material 302 is insignificant. In one embodiment, the insulating layer 304 has a thickness in a range of approximately 0.1 to approximately 10 microns. In another embodiment, after reading this specification, skilled artisans will appreciate that the thickness of the insulating layer 304 can be thinner or thicker than the range previously recited.

The semiconductor layer 306 may be substantially monocrystalline and include an uppermost surface that lies along a (100) or (110) crystal plane. The semiconductor layer 306 can include a group 14 elements the base material 302 can include a Group 14 element (e.g., silicon, carbon, germanium, or any combination thereof), a III-V (Group 13-Group 15) semiconductor (e.g., GaAs, InP, GaAlAs, etc.), a II-VI (Group 2-Group 16 or Group 12-Group 16) semiconductor (e.g., CdTe, CdSe, CdZnTe, ZnSe, ZnTe, etc.), other suitable semiconductor material capable of withstanding processing temperatures as seen in semiconductor fabrication processes, or any combination thereof. The semiconductor layer 306 may be n-type doped, p-type doped, or include a portion that is n-type doped and another portions that is p-type doped. In one embodiment, the semiconductor layer 306 has a thickness in a range of approximately 10 to approximately 1000 nm. In another embodiment, after reading this specification, skilled artisans will appreciate that the thickness of the semiconductor layer 306 can be thinner or thicker than the range previously recited. The SOI substrate 300 may be obtained from one or more commercially available sources.

Before forming the semiconductor fins 322, 324, 326, and 328, the semiconductor layer 306 overlies substantially all of the insulating layer 304. A capping layer 340 can be formed over the semiconductor layer 306 using one or more conventional or proprietary depositing techniques. In one embodiment, the capping layer 340 includes an insulating material, such as an oxide, a nitride, an oxynitride, or any combination thereof. The capping layer 340 can include one or more insulating films. A masking layer (not illustrated) may be formed over portions of the capping layer 340 and semiconductor layer 306 and patterned to include shapes, which from the top view in FIG. 3, would correspond to the shapes of the semiconductor fins 322, 324, 326, and 328. A conventional or proprietary etching technique can be used to etch through the capping layer 340 and the semiconductor layer 306 and stopping on or within the insulating layer 304. The masking layer can be removed using a conventional or proprietary technique. At this point in the process, the semiconductor fins 322, 324, 326, and 328, as illustrated in FIGS. 3 and 4, have been formed and will be the active regions for transistors within the SRAM cell being formed.

Figure 5:
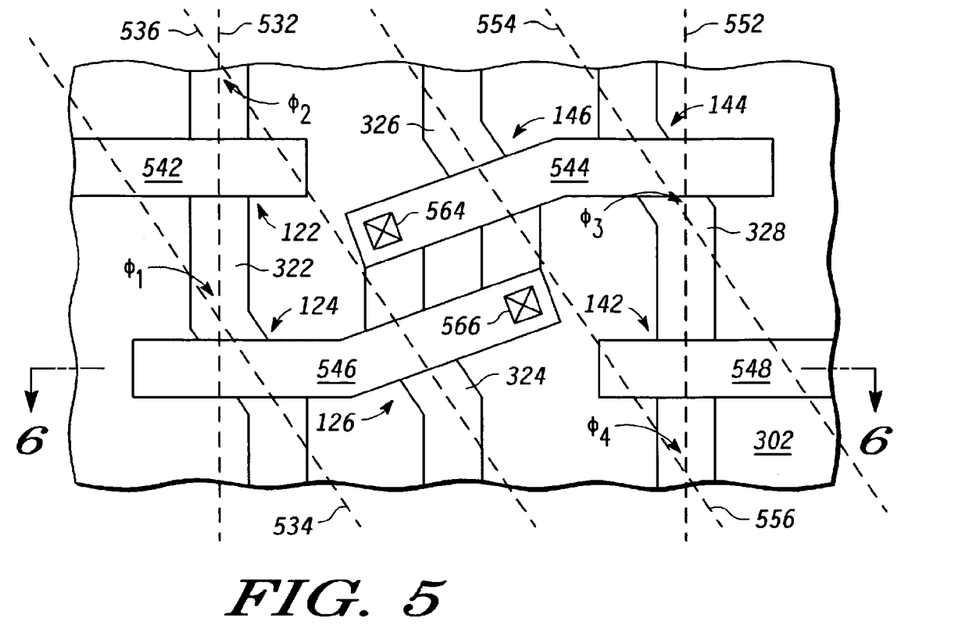
FIGS. 5 and 6 includes illustrations of a top view and a cross-sectional view, respectively, of the workpiece of FIGS. 3 and 4 after forming conductive members.
Figure 6:
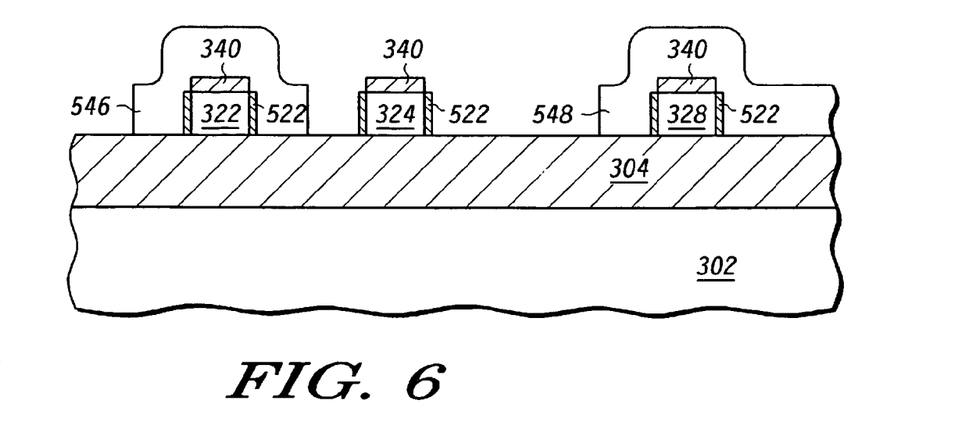

In FIGS. 5 and 6, a gate dielectric layer 522 is formed along the sidewalls of the semiconductor fins 322, 324, 326, and 328, and conductive members 542, 544,546, and 548 are formed over portions of the semiconductor fins 322, 324, 326, and 328. The sectioning line 6-6 in FIG. 5 is at a different location as compared to sectioning line 4-4 in FIG. 3. Gate dielectric layer 522 can also be formed on top of fins 322, 324, 326, and 328 at the same time as it is formed along the sidewalls if the capping layer 340 is removed prior to gate dielectric layer formation.

The gate dielectric layer 522 can include one or more films of silicon dioxide, silicon nitride, silicon oxynitride, a high dielectric constant ("high-k") material, or any combination thereof. The high-k material can include $Hf_aO_b$, $Hf_aO_bN_c$, $Hf_aSi_bO_c$, $Hf_aSi_bO_cN_d$, $Hf_aZr_bO_cN_d$, $Hf_aZr_bSi_cO_dN_e$, $Hf_aZr_bO_c$, $Zr_aSi_bO_c$, $Zr_aSi_bO_cN_d$, $Zr_aO_b$, other Hf-containing, Zr-containing, or Al-containing dielectric material, a doped version of any of the foregoing (lanthanum doped, niobium doped, etc.), or any combination thereof. As used herein, subscripts on compound materials specified with alphabetic subscripts are intended to represent the non-zero fraction of the atomic species present in that compound, and therefore, the alphabetic subscripts within a compound sum to 1. For example, in the case of $Hf_aO_bN_c$, the sum of "a," "b," and "c" is 1. Gate dielectric layer 522 can have a thickness in a range of approximately 1 to approximately 20 nm. Gate dielectric 522 may be thermally grown using an oxidizing or nitridizing ambient, or deposited using a chemical vapor deposition ("CVD") technique, physical vapor deposition ("PVD") technique, or any combination thereof. In one embodiment, an atomic layer deposition process ("ALD") is used to form gate dielectric layer 522.

Conductive members 542, 544, 546, and 548 are then formed over portions of the base material 302 and semiconductor fins 322, 324, 326, and 328 after forming the gate dielectric layer 522. The conductive members 542, 544, 546, and 548 including gate electrodes for the transistors 122, 124, 126, 142, 144, and 146. Each of the transistors includes a channel length that is a distance between subsequently-formed S/D regions underneath the gate electrode portions of the conductive members 542, 544, 546, and 548. The channel length extends in a direction substantially parallel to the sides of the semiconductor fin 322, 324, 326, or 328 as the semiconductor fin extends underneath a corresponding conductive member 542, 544, 546, or 548.

As illustrated in FIG. 5, the channel length of the pass gate transistor 122 extends along a dashed line 532. Similarly, the channel length of the pull-down transistor 124 extends along a dashed line 534, the channel length of the pull-up transistor 126 extends along a dashed line 536, the channel length of the pass gate transistor 142 extends along a dashed line 552, the channel length of transistor the pull-down 144 extends along a dashed line 554, and the channel length of the transistor pull-up 146 extends along a dashed line 556. Any one or more of the dashed lines may lie along a (100) or (110) crystal plane.

The dashed lines are extended in FIG. 5 to illustrate angles at which some of the dashed lines can intersect each other. For example, the dashed lines 532 and 534 intersect at an angle $\phi_1$, the dashed lines 532 and 536 intersect at an angle $\phi_2$, the dashed lines 552 and 554 intersect at an angle $\phi_3$, and the dashed lines 552 and 556 intersect at an angle $\phi_4$. The angle $\phi_1$, $\phi_2$, $\phi_3$, $\phi_4$, or any combination thereof may have a value that is not an integer multiple all of 22.5°. In one embodiment, angle $\phi_1$, $\phi_2$, $\phi_3$, $\phi_4$, or any combination thereof has a value in a range of and least 2° away from an integer multiple of 22.5°. When put into an equation-type formula, $$\phi_i \approx (m*22.5°+2°) \text{ to } ((m+1)*22.5°-2°),$$

wherein:

i is 1, 2, 3, or 4; and m is an integer (i.e., 0, 1, 2, etc.)

For example, the angle $\phi_1$, $\phi_2$, $\phi_3$, $\phi_4$, or any combination thereof may have a value in a range of approximately 2° to approximately 20.5°, approximately 24.5° to approximately 43°, approximately 47° to approximately 65.5°, approximately 69.5° to approximately 88°, etc.

In a particular embodiment, the angle $\phi_1$, $\phi_2$, $\phi_3$, $\phi_4$, or any combination thereof may have a value in a range of approximately 5° to 15° away from an integer multiple of 45°. When put into an equation-type formula, $$\phi_i \approx (m*45°+5°) \text{ to } (m*45°+15°) \text{ or}$$

$$\phi_i \approx (m*45°-15°) \text{ to } (m*45°-5°),$$

wherein:

i is 1, 2, 3, or 4); and m is an integer (i.e., 0, 1, 2, etc.)

For example, the angle $\phi_1$, $\phi_2$, $\phi_3$, $\phi_4$, or any combination thereof may have a value in a range of approximately 5° to approximately 15°, approximately 25° to approximately 40°, approximately 50° to approximately 65°, approximately 70° to approximately 85°, etc.

In a more particular embodiment, any one or more of the approximations in any of the foregoing formulas may be replaced by a corresponding equation (i.e., "≈" is replaced by "=").

The dashed lines 534 and 536 may be substantially parallel to or intersect each other, the dashed lines 554 and 556 may be substantially parallel to or intersect each other, the dashed lines 534 and 554 may be substantially parallel to or intersect each other, the dashed lines 536 and 556 may be substantially parallel to or intersect each other, the dashed lines 534 and 556 may be substantially parallel to or intersect each other, and the dashed lines 536 and 554 may be substantially parallel to or intersect each other.

In one particular embodiment, each of the dashed lines 534, 536, 554, and 556 lies along a (100) crystal plane, the dashed line 532 extends in a direction approximately 35° from a corresponding (100) crystal plane for the dashed line 534 or 536, and the dashed line 552 extends in a direction approximately 35° from a corresponding (100) crystal plane for the dashed line 554 or 556.

In another particular embodiment, each of the dashed lines 532 and 552 lies along a (110) crystal plane, the dashed line 534 extends in a direction approximately 35° from the corresponding (110) crystal plane for the dashed line 532, the dashed line 536 extends in a direction approximately 35° from the corresponding (110) crystal plane for the dashed line 532, the dashed line 554 extends in a direction approximately 35° from the corresponding (110) crystal plane for the dashed line 552, and the dashed line 556 extends in a direction approximately 35° from the corresponding (110) crystal plane for the dashed line 552.

Referring to FIG. 5, one or more of the semiconductor fins 322, 324, 326, or 328 and one or more of the conductive members 542, 544, 546, or 548 include at least one bend or other change in direction along their corresponding lengths. In one embodiment, each of the semiconductor fins 322, 324, 326, and 328 and each of the conductive members 542, 544, 546, and 548 includes at least one bend or other change in direction along its corresponding length. The bend or other change in direction can be over a wider variety of angles (not just integer multiples of 22.5°) allowing for more design flexibility as described later in this specification.

The conductive member 542, 544, 546, or 548, or any combination thereof can include a different portions with different work functions, different compositions, or any combination thereof. For example, a portion of conductive member 544 or 546 can include one portion for the pull-down transistor 124 or 144 and another portion for the pull-up transistor 126 or 146.

Contacts 564 and 566 are electrical connections for portions of the storage nodes for the SRAM cell. The contact 564 electrically connects the semiconductor fin 324 to the conductive member 544, and the contact 566 electrically connects the semiconductor fin 326 to the conductive member 546.

The conductive member 542, 544, 546, or 548, or any combination thereof can be formed by depositing one more layers of one or more conductive materials and patterning the layer(s) using a conventional or proprietary technique. The layer(s) and composition(s) can include one or more conventional or proprietary materials used in gate electrodes within the semiconductor arts. An example of a conductive material can include amorphous silicon, polysilicon, a nitride, a metal-containing material, another suitable material, or any combination thereof. In one embodiment, the material can include tungsten, platinum, palladium, iridium, osmium, ruthenium, rhenium, indium-tin, indium-zinc, aluminum-tin, or any combination thereof. The conductive member 542, 544, 546, and 548 can have a thickness of in a range of approximately 30 to approximately 500 nm.

After forming the conductive member 542, 544, 546, and 548, exposed portions of the semiconductor fins 322, 324, 326, and 328 can be heavily doped to form S/D regions for the transistors 122, 124, 126, 142, 144, and 146. Different ion implantations using different dopants may be used. For example, the semiconductor fins 322 and 328 may be doped with an n-type dopant to a concentration of at least approximately $1E19$ atoms/cm$^3$, and the semiconductor fins 324 and 326 may be doped with a p-type dopant to a concentration of at least approximately $1E19$ atoms/cm$^3$. Although not illustrated, a conductive material, such as a silicide, may be formed over or partly from the semiconductor fins 322, 324, 326, 328, or any combination thereof. At this point in the process, fin-type transistor structures have been formed.

Figure 7:
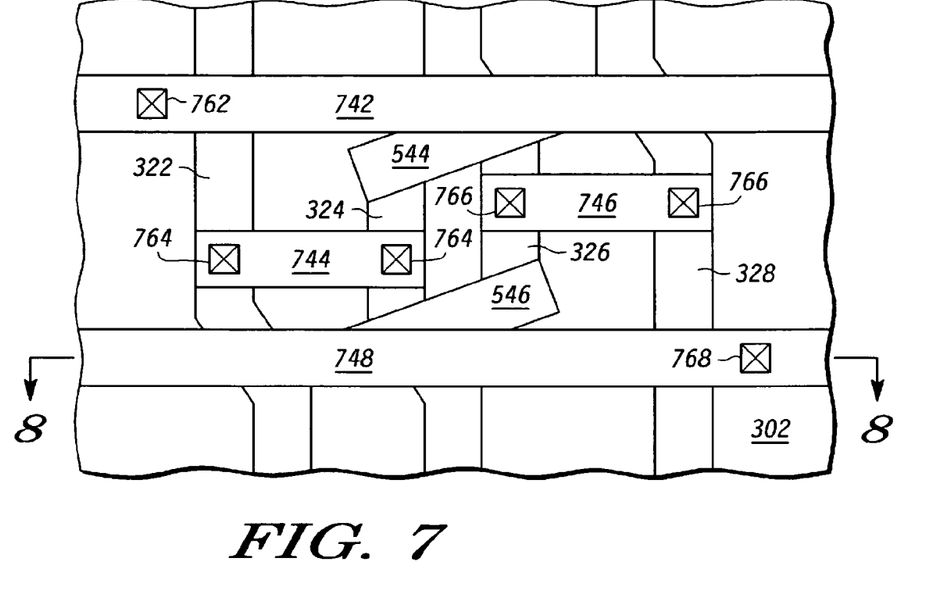
FIGS. 7 and 8 includes illustrations of a top view and a cross-sectional view, respectively, of the workpiece of FIGS. 5 and 6 after forming word lines and local interconnects.
Figure 8:
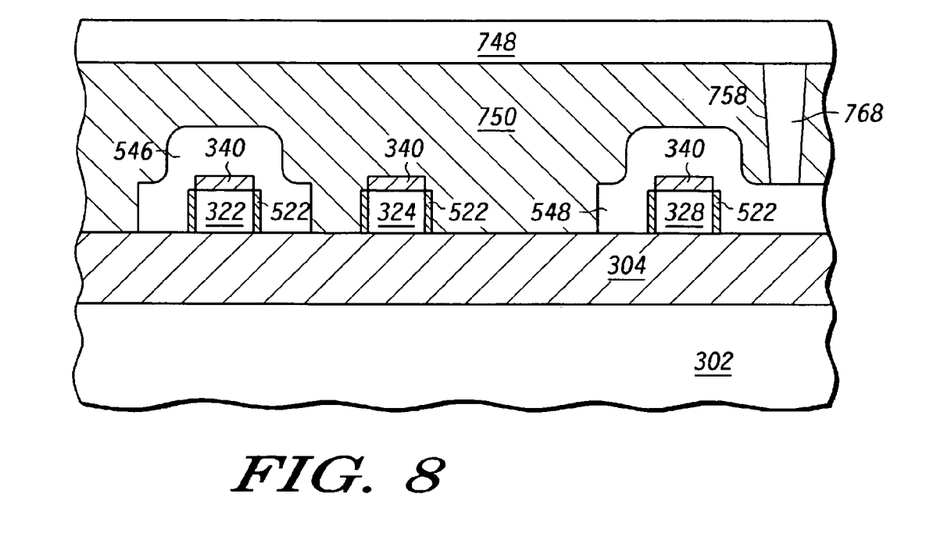

FIGS. 7 and 8 include illustrations of a top view and a cross-sectional view, respectively, after forming word lines 742 and 748, local interconnects 744 and 746, and contacts 762, 764, 766, and 768. The word lines 742 and 748 may be electrically connected to each other (not illustrated) or otherwise configured such that, after fabrication of the electronic device is substantially completed, the word lines 742 and 748 have substantially the same voltage or other signal when the electronic device is operated. The contact 762 electrically connects the word line 742 to the underlying conductive member 542, and the contact 768 electrically connects the word line 748 to the underlying conductive member 548. The local interconnects 744 and 746 and contacts 764 and 766 complete the electrical connections for the storage nodes of the SRAM cell.

Regarding formation of the word lines 742 and 748, the local interconnects 744 and 746, and the contacts 762, 764, 766, and 768, an insulating layer 750 can be formed over the conductive members 542, 544, 546, and 548 and semiconductor fins 322, 324, 326, and 328. The insulating layer 750 can include one or more films of an oxide, a nitride, or a combination thereof. The insulating layer 750 can be formed by using a conventional or proprietary depositing technique. The insulating layer can be patterned using a conventional or proprietary technique to form contact openings, including a contact opening 758 as illustrated in FIG. 8. Conductive plugs can be formed using a conventional or proprietary technique to form the contacts 762, 764, 766, and 768.

A conductive layer can be formed by depositing one or more conductive films, including aluminum, copper, tungsten, one or more other suitable conductive materials, or any combination thereof and patterning the conductive layer to form the word lines 742 and 748 and the local interconnects 744 and 746. A conventional or proprietary etching or damascene process may be used in forming the word lines 742 and 748 and the local interconnects 744 and 746.

Figure 9:
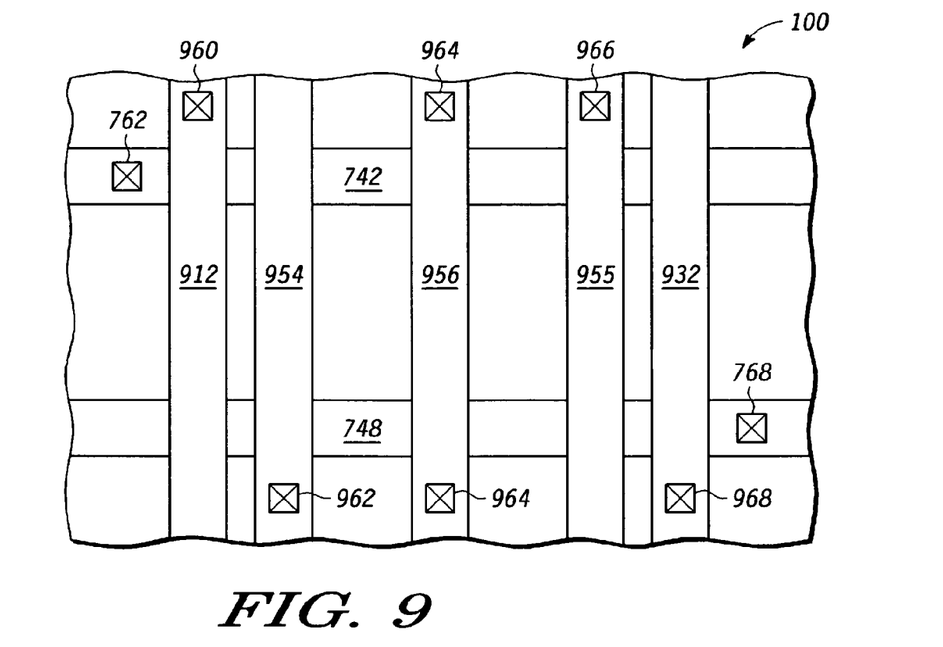
FIG. 9 includes an illustration of a cross-sectional view of the workpiece of FIGS. 7 and 8 after forming a substantially completed electronic device.

Processing can be continued to form a substantially completed electronic device, including the SRAM cell 900, as illustrated in FIG. 9. The substantially completed electronic device can include bit lines 912 and 932, $V_{SS}$ lines 954 and 955, a $V_{DD}$ line 956, and contacts 960, 962, 964, 966, and 968. In FIG. 9, only the bit lines 912 and 932, the $V_{SS}$ lines 954 and 955, the V$_{DD}$ line 956, the contacts 960, 962, 964, 966, and 968, word lines 742 and 748, and contacts 762 and 768 are illustrated to simplify understanding of the positional relationships between those features within the SRAM cell 900. Thus, although present, the semiconductor fins 322, 324, 326, and 328 are not illustrated in FIG. 9.

The bit line 912 can be electrically connected the semiconductor fin 322 (not illustrated in FIG. 9) at the contact 960. The bit line 912 corresponds to BL 112 in the circuit diagram of FIG. 1. The bit line 932 can be electrically connected the semiconductor fin 328 (not illustrated in FIG. 9) at the contact 968. The bit line 932 corresponds to BL bar 132 in the circuit diagram of FIG. 1. The V$_{SS}$ lines 954 and 955 can be electrically connected the semiconductor fins 322 and 328 (not illustrated in FIG. 9), respectively, at the contacts 962 and 966, respectively. The V$_{SS}$ lines 954 and 955 may be electrically connected to each other at a location outside of FIG. 9 or may be configured to be switched to one or more V$_{SS}$ power supply terminals (not illustrated in FIG. 9) when the SRAM cell 900 would be operated. The V$_{DD}$ line 956 can be electrically connected to the semiconductor fins 324 and 326 (not illustrated in FIG. 9) at the contacts 964.

Regarding formation of the bit lines 912 and 932, the V$_{SS}$ lines 954 and 955, the V$_{DD}$ line 956, and the contacts 960, 962, 964, 966, and 968, an insulating layer (not illustrated), the bit lines 912 and 932, the V$_{SS}$ lines 954 and 955, and the V$_{DD}$ line 956, and contacts 960, 962, 964, 966, and 968 can be formed using a convention or proprietary sequence as previously described with respect to the insulating layer 750, the word lines 742 and 748, the local interconnects 744 and 746, and the contacts 762, 764, 766, and 768 in FIGS. 7 and 8.

One or more additional insulating layer, one or more interconnect levels (including conductive lines and corresponding contacts), one or more encapsulating layers, or any combination thereof may be formed, if needed or desired. Each of the insulating layer(s), interconnect level(s), encapsulating layer(s), or any combination thereof can be formed using one or more conventional or proprietary techniques.

In one embodiment, the angle orientation of any or all of the transistors within an SRAM cell may be changed. Also, different portions of the same or different semiconductor fins can be used for one or more of the transistors within the SRAM cell.

Figure 10:
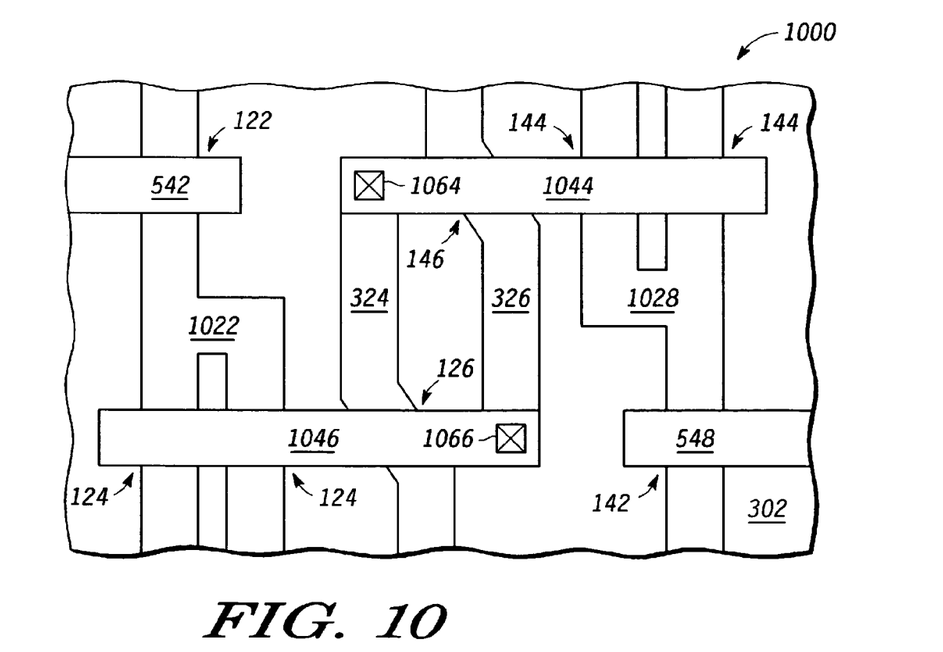
FIG. 10 includes an illustration of a cross-sectional view of a portion of a workpiece after forming semiconductor fins and conductive members in accordance with an alternative embodiment.

FIG. 10 includes an illustration of a top view of a portion of a workpiece that includes a partly completed SRAM cell 1000. Only the base material 302, semiconductor fins and conductive members are illustrated to simplify the understanding of the positional relationships between the features illustrated in FIG. 10. A semiconductor fin 1022 replaces the semiconductor fin 322 (in FIG. 5), and a semiconductor fin 1028 replaces the semiconductor fin 328 (in FIG. 5). A conductive member 1044 and a contact 1064 replace the conductive member 544 and the contact 564 (in FIG. 5), respectively, and a conductive member 1046 and a contact 1066 replace the conductive member 546 and the contact 566 (in FIG. 5), respectively.

The transistors 122, 124, 126, 142, 144, and 146 are identified in FIG. 10. Each of the pull-down transistors 124 and 144 includes two different portions of the same fin. The effective channel widths of the pull-down transistors 124 and 144 increases, and thus, increases the amount of current that the pull-down transistors 124 and 144 can carry, as compared to having corresponding transistors, each having only one of the portions of the semiconductor fin. In one embodiment, the orientations of the fins are such that the channel lengths of the pass gate transistors 122 and 142 and pull-down transistors 124 and 144 extend along lines that are substantially parallel to one another. In a particular embodiment, the lines may lie along (100) crystal planes. In another particular embodiment, the lines may lie at least 2° away from (100) crystal planes, and in a more particular embodiment, the lines may lie in a range of approximately 5° to approximately 15° from the (100) crystal planes.

The semiconductor fins 1022 and 1028 may be formed using any one or more processes are previously described with respect to the semiconductor fins 322, 324, 326, and 328. The conductive members 1044 and 1046 and the contacts 1064 and 1066 may be formed using any one or more processes are previously described with respect to the conductive members 544 and 546 and the contacts 564 and 566. In one embodiment, one or more masks may be modified to achieve the semiconductor fins 1022, 1028, the conductive members 1044, 1046, contacts 1064, 1066, or any combination thereof, as illustrated in FIG. 10.

Figure 11:
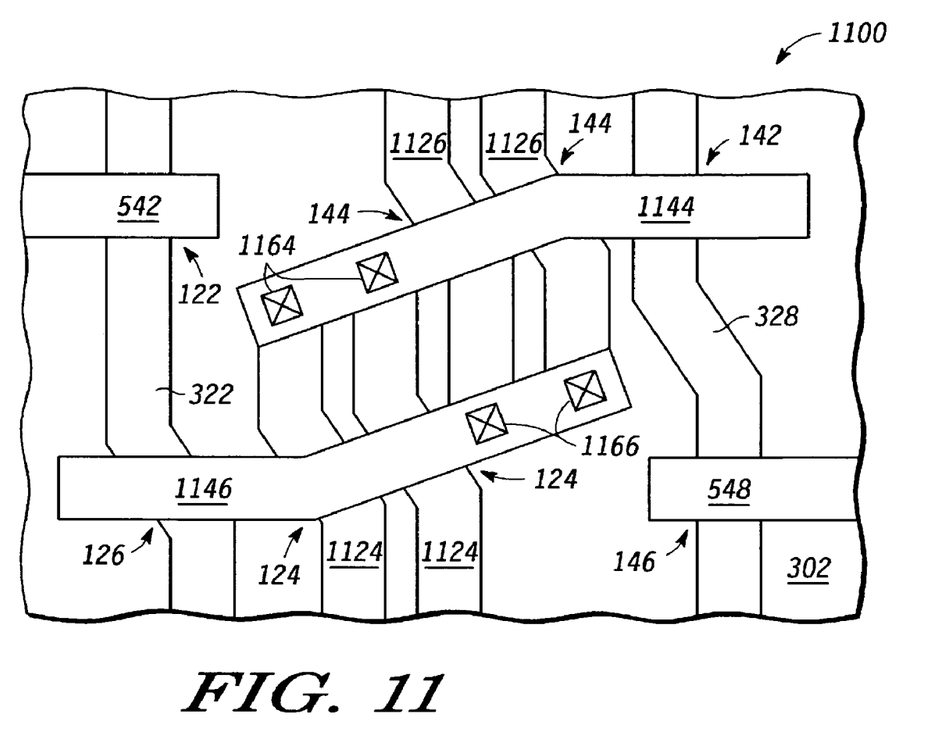
FIG. 11 includes an illustration of a cross-sectional view of a portion of a workpiece after forming semiconductor fins and conductive members in accordance with another alternative embodiment.

FIG. 11 includes an illustration of a top view of a portion of a workpiece that includes a partly completed SRAM cell 1100. Only the base material 302, semiconductor fins and conductive members are illustrated to simplify the understanding of the positional relationships between the features illustrated in FIG. 11. Semiconductor fins 1124 replace the semiconductor fin 324 (in FIG. 5), and semiconductor fins 1126 replaces the semiconductor fin 326 (in FIG. 5). A conductive member 1144 and a contact 1164 replace the conductive member 544 and the contact 564 (in FIG. 5), respectively, and a conductive member 1146 and a contact 1166 replace the conductive member 546 and the contact 566 (in FIG. 5), respectively.

The transistors 122, 124, 126, 142, 144, and 146 are identified in FIG. 11. Each of the pull-down transistors 124 and 144 includes two different semiconductor fins. The effective channel widths of the pull-down transistors 124 and 144 increases, and thus, increases the amount of current that the pull-down transistors 124 and 144 can carry, as compared to having corresponding transistors, each having only one of the semiconductor fins. In one embodiment, the orientations of the semiconductor fins are such that the channel lengths of the pass gate transistors 122 and 142 and pull-down transistors 124 and 144 extend along lines that are substantially parallel to one another. In a particular embodiment, the lines may lie along (110) crystal planes. In another particular embodiment, the lines may lie at least 2° away from (110) crystal planes, and in a more particular embodiment, the lines may lie in a range of approximately 5° to approximately 15° from the (110) crystal planes.

The semiconductor fins 1124 and 1126 may be formed using any one or more processes are previously described with respect to the semiconductor fins 322, 324, 326, and 328. The conductive members 1144 and 1146 and the contacts 1164 and 1166 may be formed using any one or more processes are previously described with respect to the conductive members 544 and 546 and the contacts 564 and 566. In one embodiment, one or more masks may be modified to achieve the semiconductor fins 1124, 1126, the conductive members 1144, 1146, contacts 1164, 1166, or any combination thereof, as illustrated in FIG. 11.

The embodiments described herein may allow an SRAM cell designer more flexibility in designing an SRAM cells. Cell size, channel length, channel width, relative angles of the channel lengths, potentially one or more other characteristics, or any combination thereof can be varied and result in different cell size, memory density, electrical characteristics, operational performance, one or more other physical or electrical characteristics, or any combination thereof. After reading this specification, SRAM cell designers will appreciate that the SRAM cell layout can be optimized for a single parameter (e.g., cell size, read access time, etc.) or for a combination of parameters (e.g., designed current or currents in or relative to other transistors within the SRAM cell, read access or write time, other suitable parameter, or any combination thereof).

In one embodiment, the SRAM cell designers may need to desire to improve drive current characteristics of the pull-up transistors related to the pass gate transistors, the pull-up transistors, or both the pass gate and pull-up transistors. In another embodiment, a smaller semiconductor fin height may be used for the pass gate transistors 122 (e.g. semiconductor fins 322 and 328) that can reduce the minimum voltage needed for writing data to the SRAM cell.

The ability to use more of a continuum of angles with respect to the channel widths in reference to crystal planes may allow an SRAM cell to be designed that is significantly superior as compared to SRAM cells that can only be designed with angles that are only integer multiples of 22.5°. The concepts described herein can be implemented by only making changes in the layouts of masks used to pattern layers within the SRAM cell. New materials, new equipment, and additional processes operations are not required.

Many different aspects and embodiments are possible. Some of those aspects and embodiments are described below. After reading this specification, skilled artisans will appreciate that those aspects and embodiments are only illustrative and do not limit the scope of the present invention.

In one aspect, an electronic device can include a static-random-access memory cell. The static-random-access memory cell can include a first transistor of a first type and a second transistor of a second type. The first transistor can have a first channel length extending along a first line, and the second transistor can have a second channel length extending along a second line. The first line and the second line can intersect at a first angle having a first value other than any integer multiple of 22.5°.

In one embodiment of the first aspect, the first value of the first angle can be at least approximately 2° away from the any integer multiple of 22.5°. In another embodiment, the first value of the first angle can be in a range of approximately 5° to approximately 15° from an integer multiple of 45°.

In still another embodiment of the first aspect, each of the first transistor and the second transistor can include a fin-type transistor structure. In a particular embodiment, the first channel length may extend substantially along a (100) crystal plane. In another particular embodiment, the second channel length may extend substantially along a (110) crystal plane. In still another particular embodiment, the first transistor can include a pull-up transistor, and the second transistor can include a pass gate transistor or a pull-down transistor.

In a more particular embodiment of the first aspect, the first transistor can include a p-channel transistor, and the second transistor can include the pass gate transistor that is an n-channel transistor. In another more particular embodiment, the first transistor can include a p-channel transistor, and the second transistor can include the pull-down transistor that is an n-channel transistor. In a further more particular embodiment, the first transistor can further include a first gate electrode and a first channel region within a first semiconductor fin portion, wherein, from a top view, the first gate electrode can have a first gate electrode length that extends along a first direction substantially perpendicular to the first channel length, and the second transistor further can include a second gate electrode and a second channel region within a second semiconductor fin portion, wherein, from a top view, the second gate electrode can have a second gate electrode length that extends along a second direction other than substantially perpendicular to the second channel length.

In a further embodiment of the first aspect, the electronic device can further include a third transistor of a third type, wherein the third transistor can have a third channel length extending along a third line, and the third line can intersect the first line and the second line. In still a further embodiment, the electronic device can further include a third transistor of a third type, wherein the third transistor can have a third channel length extending along a third line, and the third line can be substantially parallel to the first line or the second line.

In yet another embodiment of the first aspect, the static-random-access memory cell can further include a third transistor of the first type, wherein the third transistor can have a third channel length extending along a third line, and a fourth transistor of the second type, wherein the fourth transistor can have a fourth channel length extending along a fourth line. The third line and the fourth line may intersect at a second angle having a second value other than any integer multiple of 22.5°. The static-random-access memory cell can also include a fifth transistor of a third type, wherein the fifth transistor can have a fifth channel length extending along a fifth line. Source/drain regions of the first, second, and fifth transistors can be electrically connected to one another. The static-random-access memory cell can further include a sixth transistor of the third type, wherein the sixth transistor can have a sixth channel length extending along a sixth line in a sixth direction. Source/drain regions of the third, fourth, and sixth transistors can be electrically connected to one another.

In a more particular embodiment of the first aspect, the first type can include a pull-up transistor, the second type can include a pass gate transistor, and the third type can include a pull-down transistor. The first line can be substantially parallel to the third line, the second line can be substantially parallel to the fourth line, and the fifth line can be substantially parallel to the sixth line. In an even more particular embodiment, the fifth line can be substantially parallel to the first line or the second line.

In a second aspect, an electronic device can include a static-random-access memory cell. The static-random-access memory cell can include a first pull-up transistor including a source/drain region, wherein the first pull-up transistor can have a first channel length extending along a first line. The static-random-access memory cell can also include a first pass gate transistor including a source/drain region, wherein the first pass gate transistor can have a second channel length extending along a second line. The first line and the second line can intersect at a first angle having a first value other than any integer multiple of 22.5°. The static-random-access memory cell can further include a first pull-down transistor including a source/drain region. The source/drain regions of the first pull-up transistor, the first pass gate transistor, and the first pull-down transistor can be electrically connected to one another.

The static-random-access memory cell can still further include a second pull-up transistor including a source/drain region, wherein the second pull-up transistor can have a third channel length extending along a third line. The static-random-access memory cell can yet further include a second pass gate transistor including a source/drain region, wherein the second pass gate transistor can have a fourth channel length extending along a fourth line. The third line and the fourth line can intersect at a second angle having a second value other than any integer multiple of 22.5°. The static-random-access memory cell can also include a second pull-down transistor including a source/drain region. The source/drain regions of the second pull-up transistor, the second pass gate transistor, and the second pull-down transistor can be electrically connected to one another. Each of the first pull-up transistor, the first pass gate transistor, the first pull-down transistor, the second pull-up transistor, the second pass gate transistor, and the second pull-down transistor can include a fin-type transistor structure.

In one embodiment of the second aspect, the first pull-down transistor can have a fifth channel length extending along a fifth line, and the fifth line can be substantially parallel to the first line or the second line. The second pull-down transistor can have a sixth channel length extending along a sixth line in a sixth direction, and the sixth line can be substantially parallel to the third line or the fourth line.

In a third aspect, a process of forming an electronic device, including a static-random-access memory cell, can include forming a first semiconductor fin over a substrate, and forming a second semiconductor fin over the substrate, wherein the second semiconductor fin can be spaced apart from the first semiconductor fin. The process can also include forming a first gate electrode adjacent to a first portion of the first semiconductor fin, wherein the first portion can have a first length extending along a first line, and forming a second gate electrode adjacent to a second portion of the second semiconductor fin, wherein the second portion can have a second length extending along a second line. The first line and the second line can intersect at a first angle having a first value other than any integer multiple of 22.5°.

In one embodiment of the third aspect, forming the first gate electrode and forming the second gate electrode can be performed such that the first value of the first angle can be at approximately least 2° away from any integer multiple of 22.5°. In a particular embodiment, forming the first semiconductor fin and forming the first gate electrode can be performed such that the first gate electrode and first portion of the first semiconductor fin are part of a pull-up transistor, and forming the second semiconductor fin and forming the second gate electrode can be performed such that the second gate electrode and second portion of the second semiconductor fin are part of a pass gate transistor or a pull-down transistor.

Note that not all of the activities described above in the general description or the examples are required, that a portion of a specific activity may not be required, and that one or more further activities may be performed in addition to those described. Still further, the order in which activities are listed is not necessarily the order in which they are performed.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that a structural substitution, logical substitution, or another change may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. §1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed subject matter requires more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

It is to be appreciated that certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An electronic device, including a static-random-access memory cell, wherein the static-random-access memory cell comprises:
   a first transistor of a first type, wherein the first transistor has a first channel length extending along a first line; and
   a second transistor of a second type, wherein:
      the second transistor has a second channel length extending along a second line; and
      the first line and the second line intersect at a first angle having a first value other than any integer multiple of 22.5°.

2. The electronic device of claim 1, wherein the first value of the first angle is at least approximately 2° away from the any integer multiple of 22.5°.

3. The electronic device of claim 1, wherein the first value of the first angle is in a range of approximately 5° to approximately 15° from an integer multiple of 45°.

4. The electronic device of claim 1, wherein each of the first transistor and the second transistor includes a fin-type transistor structure.

5. The electronic device of claim 4, wherein the first channel length extends substantially along a (100) crystal plane.

6. The electronic device of claim 4, wherein the second channel length extends substantially along a (110) crystal plane.

7. The electronic device of claim 4, wherein:
the first transistor includes a pull-up transistor; and
the second transistor includes a pass gate transistor or a pull-down transistor.

8. The electronic device of claim 7, wherein:
the first transistor includes a p-channel transistor; and
the second transistor includes the pass gate transistor that is an n-channel transistor.

9. The electronic device of claim 7, wherein:
the first transistor includes a p-channel transistor; and
the second transistor includes the pull-down transistor that is an n-channel transistor.

10. The electronic device of claim 7, wherein:
the first transistor further includes a first gate electrode and a first channel region within a first semiconductor fin portion, wherein, from a top view, the first gate electrode has a first gate electrode length that extends along a first direction substantially perpendicular to the first channel length; and
the second transistor further includes a second gate electrode and a second channel region within a second semiconductor fin portion, wherein, from a top view, the second gate electrode has a second gate electrode length that extends along a second direction other than substantially perpendicular to the second channel length.

11. The electronic device of claim 1, further comprising a third transistor of a third type, wherein:
the third transistor has a third channel length extending along a third line; and
the third line intersects the first line and the second line.

12. The electronic device of claim 1, further comprising a third transistor of a third type, wherein:
the third transistor has a third channel length extending along a third line; and
the third line is substantially parallel to the first line or the second line.

13. The electronic device of claim 1, wherein the static-random-access memory cell further comprises:
a third transistor of the first type, wherein the third transistor has a third channel length extending along a third line;
a fourth transistor of the second type, wherein:
the fourth transistor has a fourth channel length extending along a fourth line; and
the third line and the fourth line intersect at a second angle having a second value other than any integer multiple of 22.5°;
a fifth transistor of a third type, wherein:
the fifth transistor has a fifth channel length extending along a fifth line; and
source/drain regions of the first, second, and fifth transistors are electrically connected to one another; and
a sixth transistor of the third type, wherein:
the sixth transistor has a sixth channel length extending along a sixth line in a sixth direction; and
source/drain regions of the third, fourth, and sixth transistors are electrically connected to one another.

14. The electronic device of claim 13, wherein:
the first type includes a pull-up transistor;
the second type includes a pass gate transistor;
the third type includes a pull-down transistor;
the first line is substantially parallel to the third line;
the second line is substantially parallel to the fourth line; and
the fifth line is substantially parallel to the sixth line.

15. The electronic device of claim 14, wherein the fifth line is substantially parallel to the first line or the second line.

16. An electronic device, including a static-random-access memory cell, wherein the static-random-access memory cell comprises:
a first pull-up transistor including a source/drain region, wherein the first pull-up transistor has a first channel length extending along a first line;
a first pass gate transistor including a source/drain region, wherein:
the first pass gate transistor has a second channel length extending along a second line; and
the first line and the second line intersect at a first angle having a first value other than any integer multiple of 22.5°;
a first pull-down transistor including a source/drain region, wherein the source/drain regions of the first pull-up transistor, the first pass gate transistor, and the first pull-down transistor are electrically connected to one another;
a second pull-up transistor including a source/drain region, wherein the second pull-up transistor has a third channel length extending along a third line; and
a second pass gate transistor including a source/drain region, wherein:
the second pass gate transistor has a fourth channel length extending along a fourth line; and
the third line and the fourth line intersect at a second angle having a second value other than any integer multiple of 22.5°; and
a second pull-down transistor including a source/drain region, wherein the source/drain regions of the second pull-up transistor, the second pass gate transistor, and the second pull-down transistor are electrically connected to one another,
wherein each of the first pull-up transistor, the first pass gate transistor, the first pull-down transistor, the second pull-up transistor, the second pass gate transistor, and the second pull-down transistor includes a fin-type transistor structure.

17. The electronic device of claim 16, wherein:
the first pull-down transistor has a fifth channel length extending along a fifth line;
the fifth line is substantially parallel to the first line or the second line;
the second pull-down transistor has a sixth channel length extending along a sixth line in a sixth direction; and
the sixth line is substantially parallel to the third line or the fourth line.

18. A process of forming an electronic device, including a static-random-access memory cell, wherein the process comprises:
forming a first semiconductor fin over a substrate;
forming a second semiconductor fin over the substrate, wherein the second semiconductor fin is spaced apart from the first semiconductor fin;
forming a first gate electrode adjacent to a first portion of the first semiconductor fin, wherein the first portion has a first length extending along a first line; and
forming a second gate electrode adjacent to a second portion of the second semiconductor fin, wherein the second portion has a second length extending along a second line, wherein the first line and the second line intersect at a first angle having a first value other than any integer multiple of 22.5°.

19. The process of claim 18, wherein forming the first gate electrode and forming the second gate electrode is performed such that the first value of the first angle is at approximately least 2° away from any integer multiple of 22.5°.

20. The electronic device of claim 19, wherein:

forming the first semiconductor fin and forming the first gate electrode are performed such that the first gate electrode and first portion of the first semiconductor fin are part of a pull-up transistor; and forming the second semiconductor fin and forming the second gate electrode are performed such that the second gate electrode and second portion of the second semiconductor fin are part of a pass gate transistor or a pull-down transistor.

* * * * *